(12) United States Patent
Peng et al.

(10) Patent No.: US 12,706,584 B2
(45) Date of Patent: Aug. 11, 2026

(54) ACOUSTIC WAVE DEVICE AND FILTER

(71) Applicant: EPIC MEMS (XIAMEN) CO., LTD, Xiamen (CN)

(72) Inventors: Bohua Peng, Xiamen (CN); Nianchu Hu, Xiamen (CN); Bin Jia, Xiamen (CN)

(73) Assignee: EPIC MEMS (XIAMEN) CO., LTD, Xiamen (CN)

( * ) Notice: Subject to any disclaimer, the term of this patent is extended or adjusted under 35 U.S.C. 154(b) by 742 days.

(21) Appl. No.: 18/035,550

(22) PCT Filed: Dec. 8, 2020

(86) PCT No.: PCT/CN2020/134389

§ 371 (c)(1),
(2) Date: May 5, 2023

(87) PCT Pub. No.: WO2022/095196

PCT Pub. Date: May 12, 2022

(65) Prior Publication Data

US 2023/0396228 A1 Dec. 7, 2023

(30) Foreign Application Priority Data

Nov. 6, 2020 (CN) ........................ 202011231055.5

(51) Int. Cl.
*H03H 9/02* (2006.01)
*H03H 9/17* (2006.01)

(52) U.S. Cl.
CPC .... *H03H 9/02102* (2013.01); *H03H 9/02015* (2013.01); *H03H 9/173* (2013.01)

(58) Field of Classification Search
CPC ........... H03H 9/02102; H03H 9/02015; H03H 9/173; H03H 9/02086; H03H 9/54
See application file for complete search history.

(56) References Cited

U.S. PATENT DOCUMENTS 6,384,697 B1 * 5/2002 Ruby ........................ H03H 3/02 333/187
6,424,237 B1 * 7/2002 Ruby ................... H03H 9/0211 29/25.35

(Continued)

FOREIGN PATENT DOCUMENTS

CN 103532516 A 1/2014
CN 107592091 A * 1/2018 ............. H03H 9/173

(Continued)

OTHER PUBLICATIONS

International Search Report for PCT/CN2020/134389 mailed Jul. 28, 2021, ISA/CN.

(Continued)

*Primary Examiner* — Pedro J Cuevas
(74) *Attorney, Agent, or Firm* — Yue (Robert) Xu; Apex Attorneys at Law, LLP

(57) ABSTRACT

An acoustic wave device and a filter. The acoustic wave device comprises: a substrate, a lower electrode layer, a piezoelectric layer, and an upper electrode layer, which are sequentially stacked from bottom to top, where at least one air cavity is disposed in the substrate at a region corresponding to the upper electrode layer, and at least one of: a first hanging bridge is located at a portion of the upper electrode layer which connects to outside, first hanging roofs are located at an edge and an inner portion of the upper electrode layer, and at least one via hole runs through one of the first hanging roofs which is located at the inner portion of the upper electrode layer; a quantity of the at least one air cavity is greater than one; or the upper electrode layer has a recess extending along a horizontal direction.

13 Claims, 6 Drawing Sheets

(56) References Cited

U.S. PATENT DOCUMENTS 6,714,102 B2 * 3/2004 Ruby ........................ H03H 3/02 310/365
7,161,448 B2 * 1/2007 Feng .................. H03H 9/02118 333/187
7,212,082 B2 * 5/2007 Nagao .................... H03H 9/173 333/187
8,330,325 B1 * 12/2012 Burak .................... H03H 9/173 333/187
8,902,023 B2 * 12/2014 Choy ..................... H03H 9/173 310/365
9,211,690 B1 * 12/2015 McKnight ................. B32B 3/08
9,520,855 B2 * 12/2016 Feng .................. H03H 9/02031
9,520,856 B2 * 12/2016 Choy ................. H03H 9/02118
9,673,778 B2 * 6/2017 Feng .................. H03H 9/02149
10,284,168 B2 * 5/2019 Ivira .................. H03H 9/02086
10,461,719 B2 * 10/2019 Choy ..................... H03H 9/171
10,756,700 B2 * 8/2020 Han ......................... H03H 9/54
11,101,786 B1 * 8/2021 Kubena ................ H03H 9/1021
11,362,633 B2 * 6/2022 Lin ...................... H03H 9/1042
11,949,397 B2 * 4/2024 Pang .................. H03H 9/02133
12,057,822 B2 * 8/2024 Son ........................ H03H 9/173
12,500,573 B2 * 12/2025 Abbott ............... H03H 9/02157
2002/0121405 A1 * 9/2002 Ruby ....................... H03H 3/02 181/294
2005/0275486 A1 * 12/2005 Feng .................. H03H 9/02149 333/187
2010/0327994 A1 * 12/2010 Choy ................. H03H 9/02086 310/365
2012/0161902 A1 * 6/2012 Feng ...................... H03H 9/175 333/187
2012/0218059 A1 * 8/2012 Burak .................... H03H 9/132 333/191
2013/0181579 A1 * 7/2013 Shin ....................... H10N 30/40 310/346
2014/0125202 A1 * 5/2014 Choy ..................... H03H 9/175 310/365
2014/0125203 A1 * 5/2014 Choy ..................... H03H 9/173 310/365
2014/0139077 A1 * 5/2014 Choy ................. H03H 9/02149 310/365
2015/0280687 A1 * 10/2015 Burak .................... H03H 9/175 310/321
2016/0035960 A1 * 2/2016 Lee ........................ H03H 9/173 216/13
2016/0126930 A1 5/2016 Zou et al.
2016/0197595 A1 * 7/2016 Obata .................... H03H 9/132 331/158
2017/0093368 A1 3/2017 Choy et al.
2018/0019726 A1 * 1/2018 Han ....................... H03H 9/172
2018/0123558 A1 * 5/2018 Ivira ...................... H03H 9/175
2018/0204996 A1 * 7/2018 Zou .......................... H03H 3/04
2019/0190483 A1 * 6/2019 Ivira ................. H03H 9/02086
2020/0083861 A1 * 3/2020 Matsuo ................ H03H 9/0211
2020/0195221 A1 * 6/2020 Ko ......................... H03H 9/173
2021/0050839 A1 * 2/2021 Pang .................. H03H 9/02118
2021/0359658 A1 11/2021 Lin et al.
2022/0140811 A1 * 5/2022 Lee ........................ H03H 9/132 333/187
2022/0239278 A1 * 7/2022 Son ........................ H03H 9/173
2022/0407494 A1 * 12/2022 Peng .................. H03H 9/02228
2023/0216476 A1 * 7/2023 Burak ...................... H03H 9/13 331/154
2023/0318561 A1 * 10/2023 Abbott ............... H03H 9/02157 333/187
2023/0396228 A1 * 12/2023 Peng ...................... H03H 9/173
2024/0429892 A1 * 12/2024 Li ............................ H03H 9/02
2025/0062745 A1 * 2/2025 Shirakawa ............. H03H 9/605
2025/0132744 A1 * 4/2025 Huang ............... H03H 9/02086

FOREIGN PATENT DOCUMENTS

CN 109474254 A * 3/2019 ............... H03H 3/02
CN 110061712 A 7/2019
CN 110401428 A * 11/2019 ............. H03H 9/174
CN 110601674 A 12/2019
CN 110868182 A 3/2020
CN 111431500 A 7/2020
CN 110166014 B * 9/2020 ......... H03H 9/02118
CN 111865248 A 10/2020
CN 111884617 A * 11/2020 ............... H03H 9/02
CN 114448378 A * 5/2022 ......... H03H 9/02047
CN 114938213 A * 8/2022 ......... H03H 9/02047
CN 110401428 B * 4/2023 ......... H03H 9/02007
DE 102012210160 A1 * 12/2012 ............. H03H 9/173
EP 3675357 A1 * 7/2020 ............. H03H 9/105
EP 3675357 B1 * 8/2022 ............... H03H 9/54
EP 4465537 A1 * 11/2024 ............. H03H 9/175
GB 2418791 A * 4/2006 ............. H03H 9/132
GB 2425008 A * 10/2006 ............. H03H 9/175
JP 2021503725 A * 2/2021 ............. H03H 9/105
KR 20220059778 A * 5/2022 ......... H03H 9/02102
WO WO-2019154345 A1 * 8/2019 ......... H03H 9/02047

OTHER PUBLICATIONS

The Chinese 1st Office Action issued on Mar. 28, 2025 for CN202011231055.5.

* cited by examiner

ACOUSTIC WAVE DEVICE AND FILTER

This application is the national phase of International Application No. PCT/CN2020/134389, titled “ACOUSTIC WAVE DEVICE AND FILTERING APPARATUS”, filed on Dec. 8, 2020, which claims priority to Chinese Patent Application No. 202011231055.5, titled “ACOUSTIC WAVE DEVICE AND FILTERING APPARATUS”, filed on Nov. 6, 2020 with the China National Intellectual Property Administration, which is incorporated herein by reference in its entirety.

FIELD

The present disclosure relates to the technical field of filters, and in particular, to an acoustic wave device and a filtering apparatus.

BACKGROUND

A bulk acoustic wave (BAW) device has a sandwich structure comprising an upper electrode layer, a piezoelectric layer, and a lower electrode layer, which can generate resonance. An air cavity structure or an acoustic reflection layer structure is located below the lower electrode layer, and the resonance region occurs in the piezoelectric layer. BAW devices are fundamental components of filters, duplexers, and the like.

Compared with the BAW device having the acoustic reflective layer (e.g., a solid mounted resonator, SMR), the BAW device having the air cavity (e.g., a film bulk acoustic resonator, FBAR) can transfer generated heat from the piezoelectric layer to the substrate. That is, such device has better heat dissipation, and thereby can bear greater power without malfunction. Air cavities are arranged at both a top and a bottom of the FBAR device, and only an edge of the FBAR device is connected to the substrate via the lower electrode. Hence, the device is heated when consuming high power, and a rise in temperature results in variation of a resonance frequency, a Q value, and the like, which decreases a power capacity. The highest temperature occurs at a center of the device while the lowest temperature occurs at an edge of the device, which induces a temperature gradient from the center to the edge, as shown in FIG. 1. The internal temperature gradient of the BAW device when exceeding a certain range results in two resonance peaks near the resonance frequency, which affects a filtering performance of the BAW device. The power capacity of the device may be increased in two manners. In one manner, an area of the acoustic wave device is increased. When the impedance is unchanged, the power dissipation per unit area can be reduced, and the power capacity is increased due to a slow rise of the temperature. In another manner, multiple grounding points or cooling means are provided at a peripheral of the hottest resonator, which has a limited effect on improving the power capacity due to difficulties in transmitting power of the FBAR acoustic wave to a surrounding region. Neither of the two manners can reduce the temperature gradient under high power.

Hence, it is an urgent technical problem for those skilled in the art how to reduce the rise in the temperature and a variation in the temperature gradient and thereby improve the power capacity of the BAW device under high power.

SUMMARY

An object of the present disclosure is to provide an acoustic wave device and a filtering apparatus. A rise in temperature and a variation in a temperature gradient of a bulk acoustic wave device are reduced, which improves a power capacity of the bulk acoustic wave device.

In order to address the above technical issues, an acoustic wave device is provided according to embodiments of the present disclosure. The acoustic wave device comprises: a substrate, a lower electrode layer, a piezoelectric layer, and an upper electrode layer, which are sequentially stacked from bottom to top, where at least one air cavity is disposed in the substrate at a region corresponding to the upper electrode layer, and at least one of: a first hanging bridge is located at a portion of the upper electrode layer which connects to outside, first hanging roofs are located at an edge and an inner portion of the upper electrode layer, and at least one via hole runs through one of the first hanging roofs which is located at the inner portion of the upper electrode layer; a quantity of the at least one air cavity is greater than one; or the upper electrode layer has a recess extending along a horizontal direction.

Optionally, the quantity of at least one air cavity is greater than one, and the acoustic wave device further comprises: a second hanging roof located at an edge of the upper electrode layer, and a second hanging bridge located at the portion of the upper electrode layer which connects to the outside.

Optionally, the at least one via hole runs through the one of the first hanging roofs, a quantity of the at least one via hole is greater than one.

Optionally, the at least one via hole extends to a lower surface of the lower electrode layer.

Optionally, the at least one via holes extends to a lower surface of the piezoelectric layer.

Optionally, the acoustic wave device further comprises a protection layer located on an upper surface of the upper electrode layer.

Correspondingly, in a case that the at least one via hole runs through the one of the first hanging roofs, the at least one via hole extends to an upper surface of the protection layer.

Optionally, the protection layer is made of one or a combination of: aluminum nitride, zinc oxide, lithium niobate, and lithium tantalite, which is doped with an element or undoped, where the element comprises a rare-earth element or an alkaline-earth element.

Optionally, a shape of the air cavity is an irregular polygon, of which any two sides are not parallel and any two angles are not equal.

Optionally, the upper electrode layer is made of one or a combination of: aluminum, molybdenum, copper, gold, platinum, silver, nickel, chromium, tungsten, and titanium.

A filtering apparatus is further provided according to embodiments of the present disclosure. The filtering apparatus comprises the foregoing acoustic wave device of which a quantity is at least one.

According to embodiments of the present disclosure, the acoustic wave device comprises the substrate, the lower electrode layer, the piezoelectric layer, and the upper electrode layer, which are sequentially stacked from bottom to top. At least one air cavity is disposed in the substrate at the region corresponding to the upper electrode layer. The first hanging bridge is located at the portion of the upper electrode layer which connects to the outside, the first hanging roofs are located at the edge and the inner portion of the upper electrode layer, and the at least one via hole runs through the one of the first hanging roofs which is located at the inner portion of the upper electrode layer. Alternatively, the quantity of the at least one air cavity is greater than one.

Alternatively, the upper electrode layer has the recess extending along the horizontal direction.

Herein the acoustic wave device is provided. In a first case, the upper electrode layer comprises the first hanging bridge and the first hanging roofs, and the via hole is provided in the first hanging roof located at the internal portion of the upper electrode layer. Due to the via hole, an effective resonance region of the acoustic wave device corresponds to a region between an edge of the via hole and the edge of the upper electrode layer, which shortens a distance from a resonance area to an edge of the acoustic wave device effectively. Hence, a gradient and a rise of temperature can be effectively suppressed in the acoustic wave device, and the power capacity can be improved. The first hanging roof(s) and the first hanging bridge can suppress horizontal propagation of acoustic energy effectively, weaken energy coupling between two parts of the effective resonance region which are located at left and right edges, respectively, and hence increase the Q value of the acoustic wave device. In a second case, the upper electrode layer is provided a recess extending along the horizontal direction, which can reduce a distance for heat transfer from a central region to the edge. Thereby, the gradient of the temperature gradient is suppressed, and the power capacity is increased. Alternatively, there are multiple air cavities. That is, the air cavities are separated by the substrate, and hence the effective resonance region is a ring-shaped. Thereby, a gradient and a rise of temperature can be effectively suppressed in the acoustic wave device, and the power capacity can be improved.

The filtering apparatus having the above advantages is further according to embodiments of the present disclosure.

BRIEF DESCRIPTION OF THE DRAWINGS

For clearer illustration of the technical solutions according to embodiments of the present disclosure or conventional techniques, hereinafter are briefly described the drawings to be applied in embodiments of the present disclosure or conventional techniques. Apparently, the drawings in the following descriptions are only some embodiments of the present disclosure, and other drawings may be obtained by those ordinary skilled in the art based on the provided drawings without creative efforts.

DETAILED DESCRIPTION

Hereinafter the present disclosure is illustrated in detail in conjunction with the drawings and specific embodiments in order to help those skilled in the art better understand the solution of the present disclosure. Apparently, the described embodiments are only some rather than all of the embodiments of the present disclosure. Any other embodiments obtained based on the embodiments of the present disclosure by those ordinary skilled in the art without any creative effort fall within the scope of protection of the present disclosure.

Various specific details are set forth in following description for full understanding of the present disclosure. The present disclosure may be implemented in other embodiments which are different from those described here. Those skilled in the art can made deduction without departing from a concept of the present disclosure. Hence, the present disclosure is not limited to specific embodiments which are disclosed below.

As described in the background, in a conventional BAW device having air cavities, the air cavities are arranged at both a top and a bottom, and only an edge of the device is connected to a substrate via a lower electrode. Hence, the device is heated when consuming high power, and a rise in temperature results in variation of a resonance frequency, a Q value, and the like, which decreases a power capacity.

Figure 1:
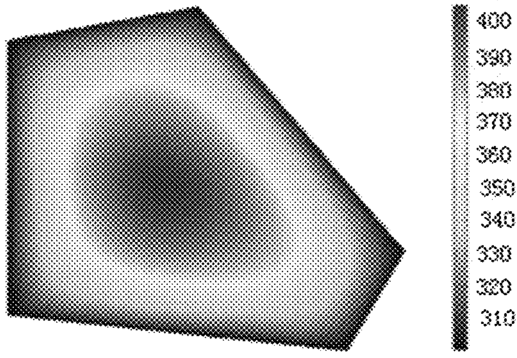
FIG. 1 is a distribution diagram of temperature gradient in a BAW device having an air cavity under high power.
Figure 2:
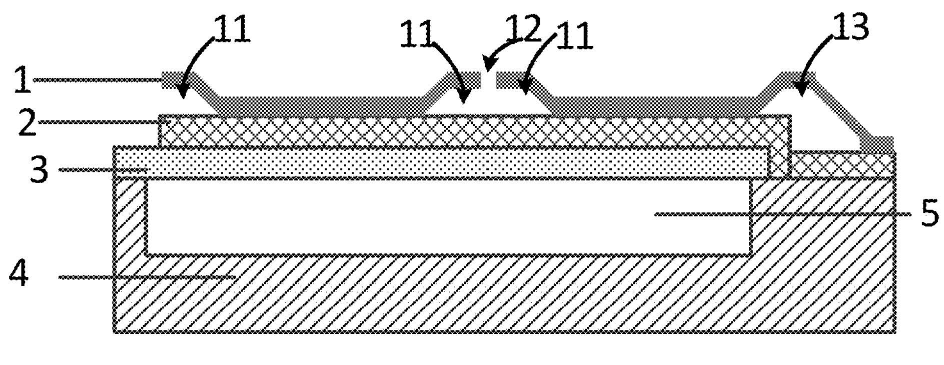
FIG. 2 is a schematic structural diagram of an acoustic wave device according to an embodiment of the present disclosure.
Figure 3:
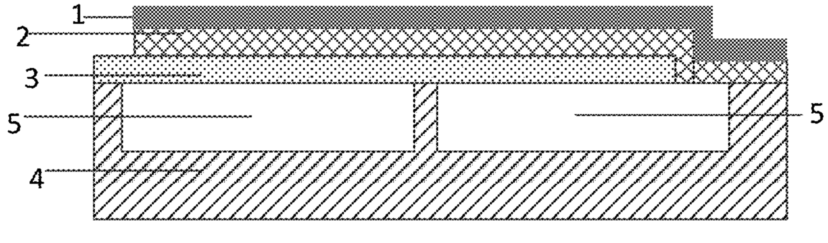
FIG. 3 is a schematic structural diagram of an acoustic wave device according to another embodiment of the present disclosure.
Figure 4:
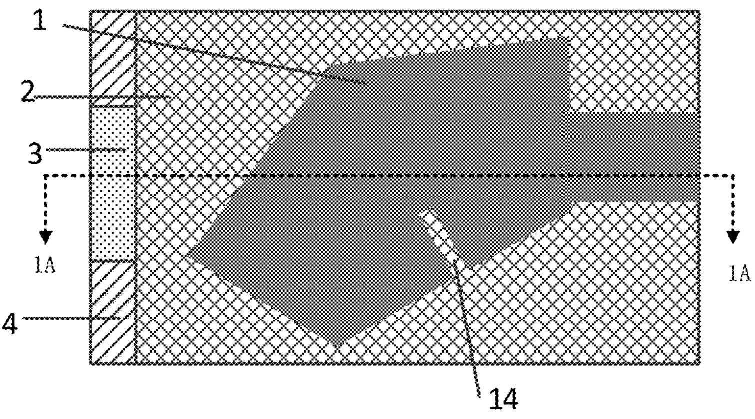
FIG. 4 is a schematic structural diagram of an acoustic wave device according to another embodiment of the present disclosure.

In view of the above, an acoustic wave device is provided according to embodiments of the present disclosure. Reference is made from FIG. 2 to FIG. 4. FIG. 2 is a schematic structural diagram of an acoustic wave device according to an embodiment of the present disclosure. FIG. 3 is a schematic structural diagram of an acoustic wave device according to another embodiment of the present disclosure. FIG. 4 is a schematic structural diagram of an acoustic wave device according to yet another embodiment of the present disclosure. The acoustic wave device comprises a substrate 4, a lower electrode layer 3, a piezoelectric layer 2, and an upper electrode layer 1, which are sequentially stacked from bottom to top.

An air cavity 5 is disposed in the substrate 4 at a region corresponding to the upper electrode layer 1.

A first hanging bridge (bridge-on-air) 13 is located at a portion of the upper electrode layer 1 which connects outside, and first hanging roofs 11 are located at an edge and an inner portion of the upper electrode layer 1, and a via hole 12 runs through the first hanging roof 11 that is located at the inner portion of the upper electrode layer 1. Alternatively, there are multiple air cavities 5. Alternatively, the upper electrode layer 1 has a recess portion extending along a horizontal direction.

The air cavity 5 corresponds to a region in which a projection of the upper electrode layer 1 and a projection of the lower electrode layer 3 overlap. Generally, a shape of the upper electrode layer 1 is irregular.

In an embodiment, a shape of the air cavity 5 is an irregular polygon, of which any two sides are not parallel and any two angles are not equal. Thereby, the reflected transverse acoustic waves are difficult to induce resonance near a resonance frequency, and hence reduce noise modes. It is appreciated that the shape of the air cavity 5 may be of another shape, such as ellipse or rectangle.

Herein the substrate 4 may be made of, but is not limited to, any one of silicon, quartz, and alumina.

The piezoelectric layer 2 may be made of, but is not limited to, any one or any combination of aluminum nitride, zinc oxide, lithium niobate, and lithium tantalite, which is either doped with an element or undoped. The element may include a rare-earth element or an alkaline-earth element.

Herein a material of the upper electrode layer 1 is not specifically limited, and may be determined on requirement. For example, the upper electrode layer 1 may be made of, but is not limited to, any one or any combination of aluminum, molybdenum, copper, gold, platinum, silver, nickel, chromium, tungsten, and titanium. Similarly, a material of the lower electrode layer 3 is not specifically limited herein. The lower electrode layer 3 may be made of, but is not limited to, any one or any combination of aluminum, molybdenum, copper, gold, platinum, silver, nickel, chromium, tungsten, and titanium.

Figure 5:
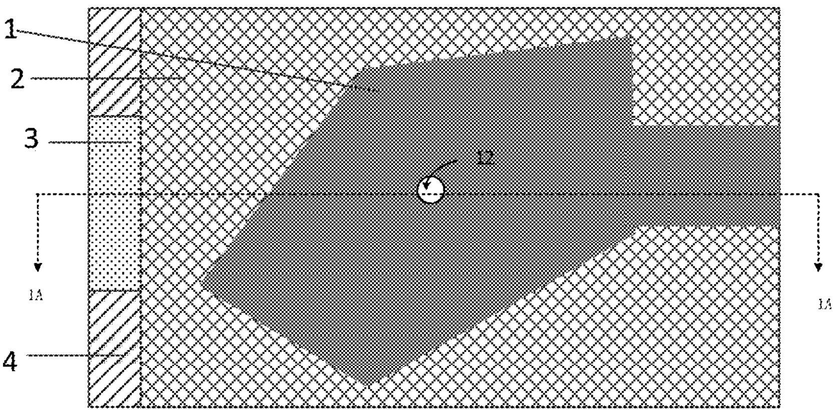
FIG. 5 is a top view of an acoustic wave device as shown in FIG. 2.

Reference is made to FIG. 2 and FIG. 5. FIG. 5 is a top view of an acoustic wave device as shown in FIG. 2. A via hole 12 runs through the upper electrode layer 1. Resonance of the acoustic wave device does not occur within an area of the via hole 12, so that an effective resonance region of the acoustic wave device is ring-shaped. An edge of the via hole 12 and an edge of the upper electrode layer 1 both serve as edges of the effective resonance region of the acoustic wave device. Hence, a distance from a central region to an edge of the resonance region is effectively shortened, which reduce the temperature gradient of the acoustic wave device effectively. Further, the first hanging roofs 11 are provided at the edge of the upper electrode layer 1 and the region in which the via hole 12 is located. Thereby, horizontal propagation of acoustic energy is effectively suppressed, energy coupling between left and right portions of the effective region is weakened, and a Q value of the acoustic wave device is improved. The first hanging bridge 13 is provided at the portion of the upper electrode layer 1 which connects the outside, which induces an impedance mismatch at such portion and restricts the acoustic energy within the effective resonance region. Hence, the Q value is improved.

Figure 6:
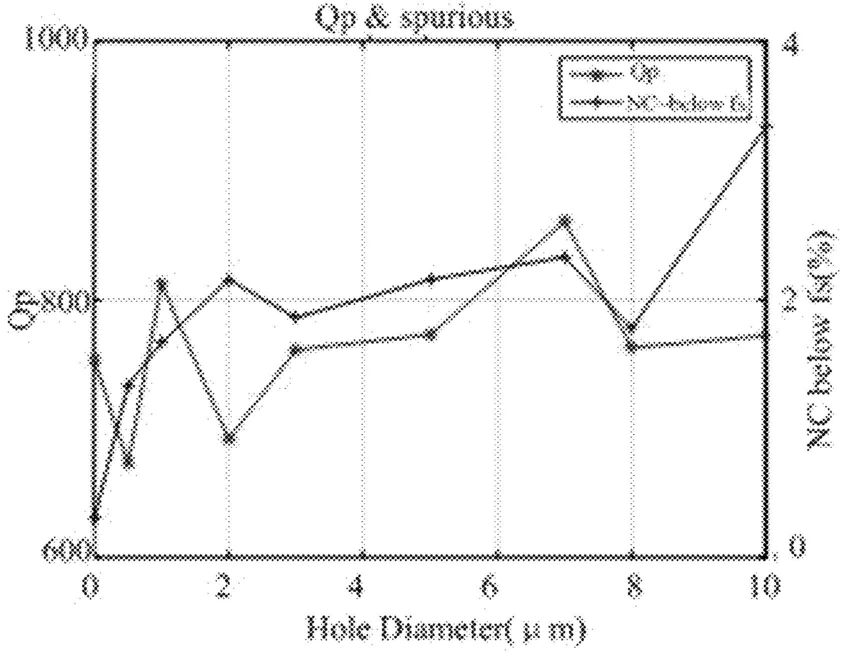
FIG. 6 is a graph of a Qp value and an intensity of a spurious mode with respect to a diameter of a via hole in an acoustic wave device.
Figure 7:
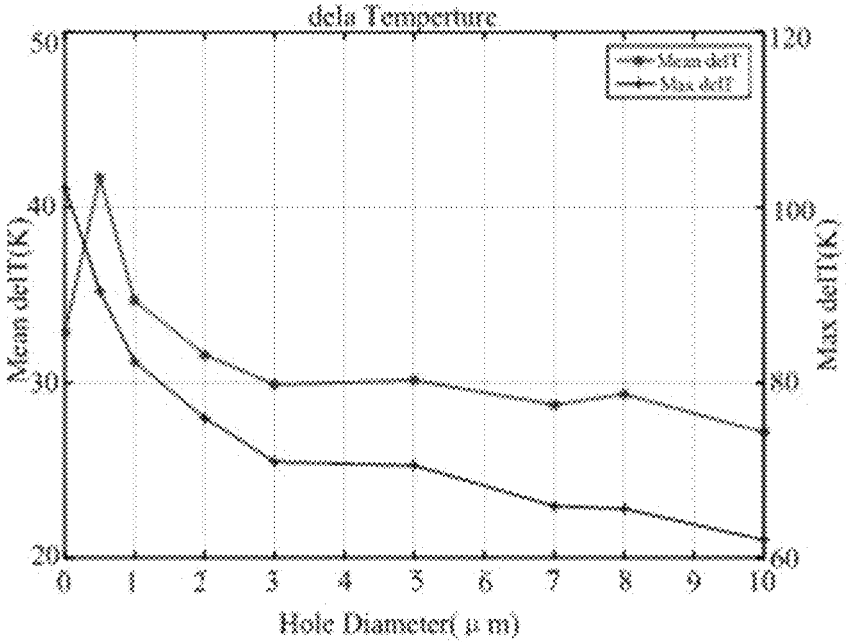
FIG. 7 is a graph of an average rise in temperature and a maximum rise in the temperature with respect to a diameter of a via hole in an acoustic wave device as shown in FIG. 2 under power of 32 dBm.

In an embodiment, a diameter of the via hole 12 is no greater than 2 μm. A reason of such configuration lies in that the diameter of the via hole 12 has a certain influence on small-signal performances of the acoustic wave device, which is discovered through simulation. Reference is made to FIG. 6, which shows a graph of the Qp (a quality factor at anti-resonance) value and an intensity of a spurious mode with respect to the diameter of a via hole of an acoustic wave device. A horizontal coordinate is the diameter of the via hole, a left vertical coordinate is the Qp value, and a right vertical coordinate is the intensity of the spurious mode. As shown in FIG. 6, an increase in the diameter of the via hole 12 increases induces a greater spurious mode in the acoustic wave device, while the Qp value is barely relevant to a change in the diameter of the via hole 12. Further, reference is made to FIG. 7, which is a graph of an average rise and a maximum rise in temperature with respect to a diameter of a via hole of an acoustic wave device as shown in FIG. 2 under power of 32 dBm. A horizontal coordinate is the diameter of the via hole, a left vertical coordinate is the average rise in temperature (i.e., mean increased temperature), and a right vertical coordinate is the maximum rise in temperature (i.e., maximum increased temperature). As shown in FIG. 7, an increase of the diameter of the via hole 12 leads to a decrease in both the maximum rise and the average rise. That is, the simulation confirms that that configuration of the via hole 12 is effective. The results of the simulation shows that the diameter of the via hole should be configured below 2 μm, such that the rise in the temperature is reduced without inducing a strong spurious mode.

Figure 8:
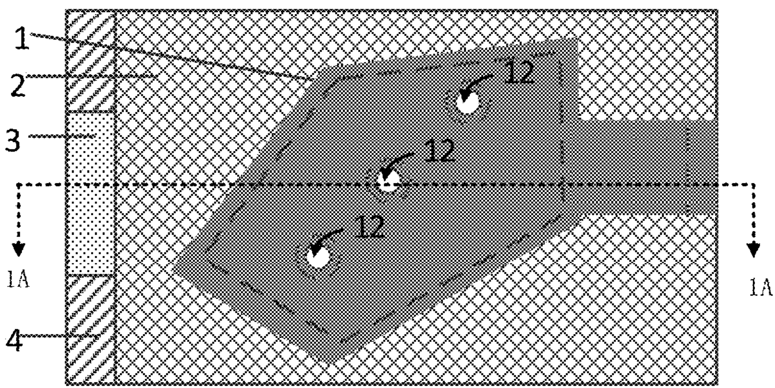
FIG. 8 is a top view of an acoustic wave device according to another embodiment of the present disclosure.

In an embodiment, in the case that the via hole 12 runs through the first hanging roof 11, there may be multiple via holes 12. Reference is made to FIG. 8, which shows a top view of an acoustic wave device. The acoustic wave device has multiple via holes 12. Hence, the distance from the hottest portion of the acoustic wave device to the edge of the upper electrode layer 1 is further reduced, and thereby the gradient of temperature is further reduced, which improves the power capacity of the acoustic wave device.

In a case that there is only one via hole 12, the via hole 12 is generally arranged at a central region of the upper electrode layer 1.

Further, the via hole 12 may extend to a lower surface of the lower electrode layer 3. That is, the via hole 12 runs through the upper electrode layer 1, the piezoelectric layer 2, and the lower electrode layer 3. In such case, the via hole 12 may further serve as a hole for releasing a sacrificial layer which is configured to form the air cavity 5. Hence, a quantity of release channels in normal positions can be reduced, and the release is more thorough. It is appreciated that the via hole 12 may alternatively extend to a lower surface of the piezoelectric layer 2. The present disclosure is not limited thereto.

As shown in FIG. 3, there are two air cavities 5, and the adjacent air cavities 5 are separated by the substrate 4. Hence, the effective resonance region of the acoustic wave device is ring-shaped, which reduces the distance from the hottest region to the edge. Thereby, a rise and a gradient in temperature are suppressed, which improves the power capacity.

Figure 9:
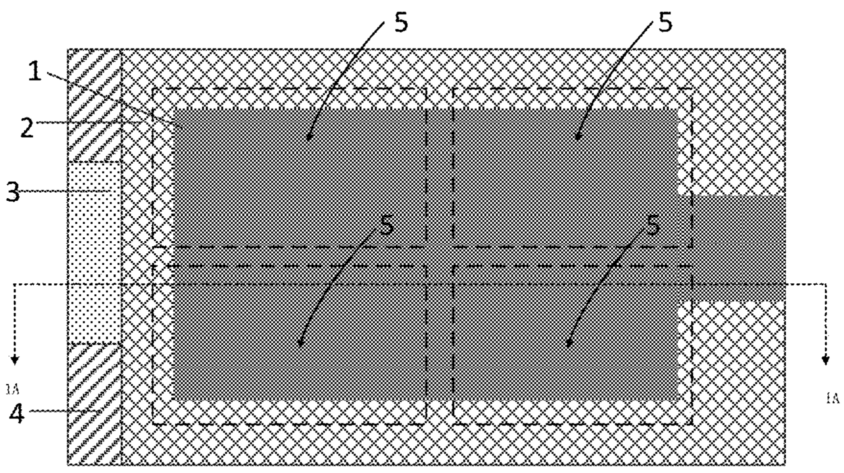
FIG. 9 is a top view of an acoustic wave device according to another embodiment of the present disclosure.

Herein the quantity of air cavities 5 is not limited to two, and may be more than two. For example, there are four air cavities, as shown in FIG. 9. The four air cavities 5 are arranged as a 2×2 matrix, which also suppress the rise and the gradient in temperature. Compared with the acoustic wave device as shown in FIG. 3, the acoustic wave device as shown in FIG. 9 has a smaller effective resonance region and a greater mechanical strength.

As shown in FIG. 4, the upper electrode layer 1 has a recess extending along the horizontal direction. That is, a shape of the upper electrode layer 1 is closed and has an inward recess, which can also reduce a distance of heat transfer from the central region to the edge. Thereby, the rise and the gradient in temperature are suppressed, which improves the power capacity.

Herein the acoustic wave device is provided. In a first case, the upper electrode layer 1 comprises the first hanging bridge 13 and the first hanging roofs 11, and the via hole 12 is provided in the first hanging roof 11 located at the internal portion of the upper electrode layer. Due to the via hole 12, an effective resonance region of the acoustic wave device corresponds to a region between an edge of the via hole 12 and the edge of the upper electrode layer 1, which shortens a distance from a resonance area to an edge of the acoustic wave device effectively. Hence, a gradient and a rise of temperature can be effectively suppressed in the acoustic wave device, and the power capacity can be improved. The first hanging roof(s) 11 and the first hanging bridge 13 can suppress horizontal propagation of acoustic energy effectively, weaken energy coupling between two parts of the effective resonance region which are located at left and right edges, respectively, and hence increase the Q value of the acoustic wave device. In a second case, the upper electrode layer 1 is provided a recess extending along the horizontal direction, which can reduce a distance for heat transfer from a central region to the edge. Thereby, the gradient of the temperature gradient is suppressed, and the power capacity is increased. Alternatively, there are multiple air cavities 5. That is, the air cavities 5 are separated by the substrate 4, and hence the effective resonance region is a ring-shaped. Thereby, a gradient and a rise of temperature can be effectively suppressed in the acoustic wave device, and the power capacity can be improved.

Figure 10:
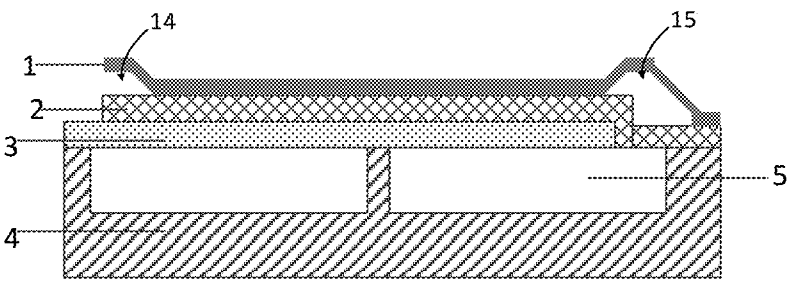
FIG. 10 is a top view of an acoustic wave device according to another embodiment of the present disclosure.

Reference is made to FIG. 10. On a basis of the above embodiments, in a case that there are multiple air cavities 5, the acoustic wave device further comprises a second hanging roof 14 and a second hanging bridge 15.

The second hanging roof 14 is located at an edge of the upper electrode layer 1, and the second hanging bridge 15 is located at the portion of the upper electrode layer 1 which connects outsides. The second hanging roof 14 can suppress the transverse propagation of acoustic energy effectively, weaken the energy coupling between the left and right portions of the effective resonance region, and improve the Q value of the device. The second hanging bridge 15 induces an impedance mismatch at the edge to restrict the acoustic energy within the effective resonance region, so as to further improve the Q value.

Figure 11:
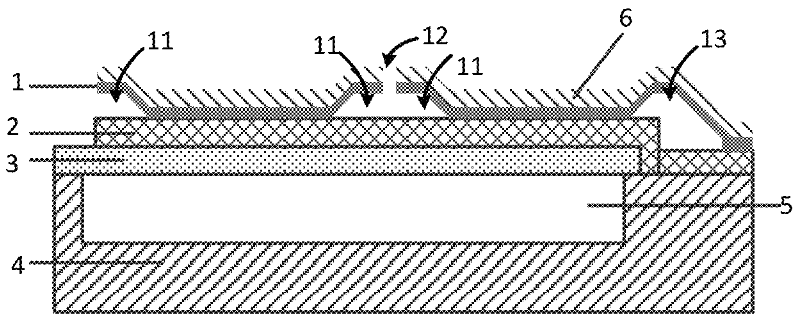
FIG. 11 is a top view of an acoustic wave device according to another embodiment of the present disclosure.

Reference is made to FIG. 11. On a basis of any foregoing embodiment, the acoustic wave device may further comprise a protection layer 6.

The protection layer 6 is located on an upper surface of the upper electrode layer 1.

Correspondingly, in a case that the via hole 12 runs through the first hanging roof 11, the via hole 12 extends to an upper surface of the protection layer 6.

The protection layer 6 may be made of, but is not limited to, any one or any combination of aluminum nitride, zinc oxide, lithium niobate, and lithium tantalite, which is doped with an element or undoped. The element includes a rare-earth element or an alkaline-earth element.

The rare-earth element includes scandium, lanthanum, cerium, praseodymium, samarium, europium, or the like. The alkaline-earth element includes beryllium, magnesium, calcium, strontium, or the like.

The protection layer 6 is configured to protect the upper electrode layer 1, so as to reduce damages on the upper electrode layer 1. Thereby, a service life of the acoustic wave device is prolonged.

In an embodiment, the via hole 12 runs through the protection layer 6, the upper electrode layer 1, and the piezoelectric layer 2, which can weaken the energy coupling between the portions of the effective resonance region located at left and right, respectively, of the via hole 12. Hence, the Q value of the acoustic wave device is improved.

Figure 12:
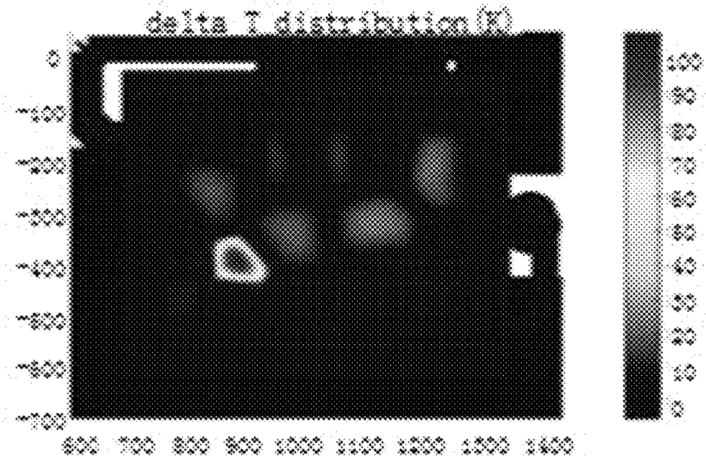
FIG. 12 is a distribution diagram of a rise in temperature in a packaging layout of a conventional filter.
Figure 13:
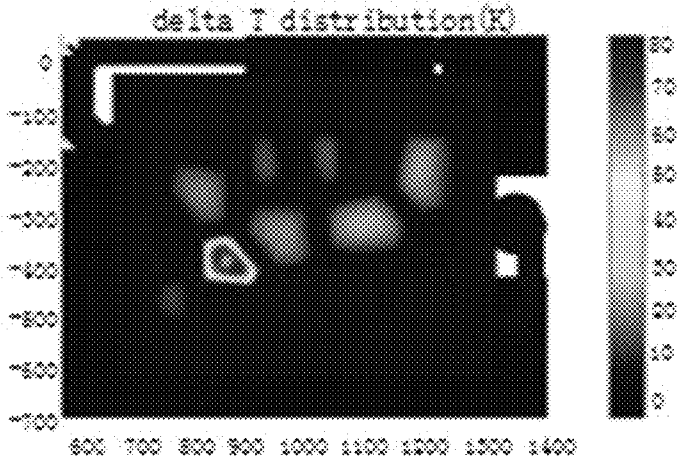
FIG. 13 is a distribution diagram of a rise in temperature in a packaging layout of a filter fabricated from a device as shown in FIG. 2 according to an embodiment of the present disclosure.

Hereinafter an example is taken to illustrate comparison between the acoustic wave device according to an embodiment of the present disclosure and a conventional acoustic wave device. A first filter is formed by 10 conventional acoustic wave devices, a second filter is formed by 10 acoustic wave devices as shown in FIG. 2, and a signal of 32 dBm is applied to inputs of the both filters. There is one acoustic wave device subject to highest temperature in each of the first filter and the second filter. The highest temperature among the first filter is above 100° C., and occurs at a center of such acoustic device. In comparison, the highest temperature among the second filter is about 80° C. Since the acoustic wave devices in the second filter has the via hole, the highest temperature occurs not at the central region of the device but at an intermediate region between the central region and a polygonal edge of the upper electrode layer, which shortens the distance of heat transfer from the hottest position effectively. As a result, the gradient of temperature is reduced and the power capacity is improved in the acoustic wave device. FIG. 12 shows a distribution diagram of temperature rise of a packaging layout of the conventional filter, and FIG. 13 shows a distribution diagram of temperature rise of a packaging layout of a filter formed by an acoustic wave device as shown in FIG. 2.

A method for manufacturing an acoustic wave device is further provided according to an embodiment of the present disclosure. The method comprises steps S101 to S105.

In step S101, the substrate is patterned, and a first sacrificial layer is deposited on the substrate.

In step S102, the substrate is subject to chemical mechanical polishing (CMP) to define a release region.

In step S103, a lower electrode layer and then a piezoelectric layer are grown on an upper surface of the substrate.

In step S104, in a case that the first sacrificial layer covers an integral region, a second sacrificial layer is grown on an upper surface of the piezoelectric layer, an upper electrode layer is grown on an upper surface of an integral of the second sacrificial layer and the piezoelectric layer, the upper electrode layer is patterned to define each release hole for the first sacrificial layer and the second sacrificial layer, and the upper electrode layer is etched to form a via hole. A diameter of the via hole is no greater than 2 μm. Alternatively, in a case that the first sacrificial layer has multiple separate regions, an upper electrode layer is grown on an upper surface of the piezoelectric layer, and the upper electrode layer is patterned. Alternatively, an upper electrode layer is grown on an upper surface of the piezoelectric layer, and the upper electrode layer is patterned, such that the upper electrode layer has a recess extending along a horizontal direction.

In step S105, the first sacrificial layer and the second sacrificial layer are released to obtain the acoustic wave device.

When releasing the first sacrificial layer and the second sacrificial layer, a first hanging bridge is formed at a portion of the upper electrode layer which connects to outside of the acoustic wave device, and first hanging roofs are formed at an edge and an inner portion of the upper electrode layer. The via hole runs through the first hanging roof located at the inner portion of the upper electrode layer. In a case that there is no second sacrificial layer, only the first sacrificial layer is released. In such case, the acoustic wave device has multiple cavities, or the upper electrode layer of the acoustic wave device has the recess extending along the horizontal direction.

The first sacrificial layer and the second sacrificial layer may be made of, but is not limited to, silicon dioxide, phosphosilicate glass, porous silicon, photoresist, or the like.

A filtering apparatus is further provided according to embodiments of the present disclosure. The filtering apparatus comprises at least one acoustic wave device as described in the foregoing embodiments.

The filtering apparatus may be a filter, a duplexer, or the like.

The embodiments of the present disclosure are described in a progressive manner, and each embodiment places emphasis on the difference from other embodiments. Therefore, one embodiment can refer to other embodiments for the same or similar parts. Since the method disclosed in the embodiments corresponds to the apparatus disclosed in the embodiments, the description of the method is simple, and reference may be made to the relevant part of the apparatus.

Hereinabove the acoustic wave device and filtering apparatus according to embodiments of the present disclosure are described in detail. Principles and implementations of the present disclosure are described by using specific embodiments. The description of the above embodiments is merely intended to help understand the method and the key concepts of the present disclosure. It should be noted that those skilled in the art may make some variations and improvements to the present disclosure without departing from the principle of the present disclosure, and such variations and improvements fall within the protection scope of the claims of the present disclosure.

The invention claimed is:

1. An acoustic wave device, comprising:

a substrate, a lower electrode layer, a piezoelectric layer, and an upper electrode layer, which are sequentially stacked from bottom to top, wherein:

at least one air cavity is disposed in the substrate at a region corresponding to the upper electrode layer, and at least one of:

a first hanging bridge is located at a portion of the upper electrode layer which connects to outside of the acoustic wave device, first hanging roofs are located at an edge and an inner portion of the upper electrode layer, and at least one via hole runs through one of the first hanging roofs which is located at the inner portion of the upper electrode layer;

a quantity of the at least one air cavity is greater than one; or the upper electrode layer has a recess extending along a horizontal direction.

2. The acoustic wave device according to claim 1, wherein the quantity of at least one air cavity is greater than one, and the acoustic wave device further comprises:

a second hanging roof, located at an edge of the upper electrode layer, and a second hanging bridge, located at the portion of the upper electrode layer which connects to the outside.

3. The acoustic wave device according to claim 1, wherein the at least one via hole runs through the one of the first hanging roofs, and a quantity of the at least one via hole is greater than one.

4. The acoustic wave device according to claim 3, wherein the at least one via hole extends to a lower surface of the lower electrode layer.

5. The acoustic wave device according to claim 3, wherein the at least one via holes extends to a lower surface of the piezoelectric layer.

6. The acoustic wave device according to claim 1, further comprising:

a protection layer, located on an upper surface of the upper electrode layer;

wherein when the at least one via hole runs through the one of the first hanging roofs, the at least one via hole extends to an upper surface of the protection layer.

7. The acoustic wave device according to claim 6, wherein the protection layer is made of one or a combination of:

aluminum nitride, zinc oxide, lithium niobate, and lithium tantalite, which is doped with an element or undoped, wherein the element comprises a rare-earth element or an alkaline-earth element.

8. The acoustic wave device according to claim 7, wherein a shape of a cross section of the air cavity is an irregular polygon, of which any two sides are not parallel and any two angles are not equal.

9. The acoustic wave device according to claim 8, wherein the upper electrode layer is made of one or a combination of:

aluminum, molybdenum, copper, gold, platinum, silver, nickel, chromium, tungsten, and titanium.

10. A filtering apparatus, comprising at least one acoustic wave device, each of which is the acoustic wave device according to claim 1.

11. The acoustic wave device according to claim 3, further comprising:

a protection layer, located on an upper surface of the upper electrode layer;

wherein when the at least one via hole runs through the one of the first hanging roofs, the at least one via hole extends to an upper surface of the protection layer.

12. The acoustic wave device according to claim 4, further comprising:

a protection layer, located on an upper surface of the upper electrode layer;

wherein when the at least one via hole runs through the one of the first hanging roofs, the at least one via hole extends to an upper surface of the protection layer.

13. The acoustic wave device according to claim 5, further comprising:

a protection layer, located on an upper surface of the upper electrode layer;

wherein when the at least one via hole runs through the one of the first hanging roofs, the at least one via hole extends to an upper surface of the protection layer.

* * * * *